US005539235A

United States Patent [19]

Allee

[11] Patent Number: 5,539,235

[45] Date of Patent: Jul. 23, 1996

[54] METAL PROGRAMMED TRANSISTOR ARRAY

[75] Inventor: Daren L. Allee, Austin, Tex.

[73] Assignee: Advanced Micro Devices, Inc., Sunnyvale, Calif.

[21] Appl. No.: 402,721

[22] Filed: Mar. 13, 1995

Related U.S. Application Data

[63] Continuation of Ser. No. 192,009, Feb. 4, 1994, abandoned.

[51] Int. Cl.[6] .......................... H01L 29/76; H01L 21/265

[52] U.S. Cl. .......................... 257/390; 257/752; 257/773; 437/48; 437/49; 437/180

[58] Field of Search .................................... 257/390, 752, 257/773; 437/48, 49, 180

[56] References Cited

U.S. PATENT DOCUMENTS 5,164,814 11/1992 Okumura ................................ 257/390
5,275,962 1/1994 Hashimoto .............................. 257/390

*Primary Examiner*—Edward Wojciechowicz

*Attorney, Agent, or Firm*—H. Dale Langley, Jr.

[57] ABSTRACT

A semi-conductor device has a substrate with an oxide layer thereover. Within the oxide layer are a plurality of rows of polycrystalline material which represent the rows in the transistor array. Over the top of the oxide material are a plurality of columns of metal areas which represent the columns of the transistor array. Below each intersection of a metal layer and a gate layer are contact areas in the substrate which align with the gate to form a transistor within the semi-conductor device. The source implant for all transistors are connected to ground. The drain implant of each transistor is connected to the metal layer above through a window in the oxide material only if a transistor is required at the specific row and column intersection for a specific pre-programed memory. By forming an array of transistors and controlling the use of a transistor at specific row and column intersections by controlling whether the column connects electrically with the drain implant of the transistor, the mask changes are performed at a later stage in the manufacturing process. Mask changes are performed for connection of transistors in the contact windows etching mask, leaving fewer steps for completion of the semi-conductor from customizing the design to unique customer requirements.

2 Claims, 6 Drawing Sheets

METAL PROGRAMMED TRANSISTOR ARRAY

This is a continuation of application Ser. No. 08/192,009, filed Feb. 4, 1994 now abandoned.

CROSS-REFERENCE TO RELATED APPLICATIONS

This application is related to the following U.S. Patent Applications:

| SER. NO. | TITLE | INVENTOR(S) |
|---|---|---|
| 07/917,497 | General I/O Port Interrupt Mechanism | Gulick, et al. |
| 07/917,489 | Improved External Memory Access Control for a Processing Unit | Gulick, et al. |
| 07/917,488 | Method of Weak Pull-up Disable and Mechanism Therefor for Use with Microcontroller in Integrated Circuit and Cordless Telephone Using the Integrated Circuit | Bowles, et al. |
| 07/917,503 | Interrupt Mask Disable Circuit and Method | Bowles, et al. |
| 07/918,627 | Integrated Circuit and Cordless Telephone Using the Integrated Circuit | Gulick, et al. |
| 07/918,626 | Modulator Test System | Peterson, et al. |
| 07/918,625 | Keypad Scanner Process and Device and Cordless Telephone Employing the Mechanism | Gulick |
| 07/918,624 | Serial Interface Module and Method | Gulick, et al. |
| 07/918,631 | Low Power Emergency Telephone Mode | Peterson, et al. |
| 07/918,632 | In-Circuit Emulation Capability Mode in Integrated Circuit and Cordless Telephone Using the Integrated Circuit | Gulick, et al. |
| 07/918,622 | Clock Generator Capable of Shut-down Mode and Clock Generation Method | Peterson, et al. |
| 07/918,621 | Signal Averager | Gulick |
| 08/192,007 | Power Management Circuit for Use in Digital Cordless Telephones and Like Apparatus | Hendrickson, et al. |
| 08/191,949 | Apparatus and Method for Sending Signal Data | Schizlein, et al. |
| 08/579,075 | Burst Synchronization of Time Division Multiplexed Transceiver Pairs | Schnizlein |
| 08/191,994 | Receiver Quality Measurement System for Use in Digital Cordless Telephones and Like Apparatus | Hendrickson, et al. |
| 08/192,046 | Dual-Mode Baseband Controller for Radio-Frequency Interfaces Relating to Digital Cordless Telephones | Hendrickson, et al. |
| 08/192,057 | Method and Apparatus for External Intermediate Data Processing | Mullins, et al. |
| 08/191,948 | Input/Output Data Port and Method | Mullins, et al. |
| 08/191,818 | Method and Apparatus for Improved Link Establishment and Monitoring in a Communications System | Hendrickson |

All of the related applications are assigned to the assignee of the present invention and are hereby incorporated herein in their entirety by this reference thereto.

MASK WORK NOTICE

A portion of the disclosure of this patent document may contain material which is subject to mask work protection. The mask work owner has no objection to the facsimile reproduction by anyone of the patent document or the patent disclosure, as it appears in the Patent and Trademark Office patent file or records, but otherwise reserves all mask work rights whatsoever.

BACKGROUND OF THE INVENTION

1. Field of the Invention

The invention relates to semi-conductor devices and, more particularly, to semi-conductor devices having an array of transistors connected in a predetermined arrangement.

2. Description of the Related Art

Silicon semi-conductor devices are manufactured through a series of steps carried out in a particular order. The way in which those steps are carried out is crucial to the result achieved from the manufacturing process. The main objective in manufacturing those devices is to obtain a device which conforms to geographical figures of a particular, desired design for the device. In order to obtain this objective, steps in the manufacturing process must be closely controlled to ensure that rigid requirements, for example, of exacting tolerances, quality materials, and clean environment, are met.

A wide variety of processing techniques may be employed in manufacturing silicon semi-conductor devices, such as ROM storage devices. In most devices, silicon is employed as a semi-conductor for conducting of electricity. The device manufacturing process typically begins with a silicon wafer work piece. The silicon wafer work piece is formed of a single-crystal silicon (Si). Single-crystal silicon is required because optimization of the final product device depends upon the conformance of the device through each fabrication step to particular geographic requirements. This can be better understood by further consideration of typical steps in the manufacturing process of a silicon integrated circuit device.

Beginning with a silicon wafer, a desired pattern is transferred to the surface of the wafer. This pattern may be formed on the wafer surface in a variety of manners. In many instances, a layer of silicon dioxide ($SiO_2$, herein "oxide") is grown upon the surface of the wafer. Silicon dioxide serves as an insulative material and so is often used to separate the various semi-conducting layers of integrated circuit devices. A variety of methods may be employed to force oxide growth on the wafer, including, for example, thermal oxidation. In thermal oxidation, silicon on the wafer reacts with oxygen to form a continuous layer of high-quality silicon dioxide. A film of silicon dioxide could also be formed on the surface of a wafer in other manners.

The silicon dioxide is formed on the wafer's surface in uniform layers or in particular patterns, as desired. A variety of techniques, including, for example, photolithography, may be employed to achieve desired wafer surface configurations. In photolithography, a photo resist material, for example, a photo-sensitive polymer, may be layered atop a somewhat uniform silicon dioxide layer on a wafer surface. A mask having a desired design of clear and opaque areas may then be positioned atop the photo resist layer. Photo resist will respectively respond to UV light. As a result of this selective response characteristic of photo resist, the photo resist can be selectively subjected to UV light to form particular patterns of photo resist material atop the silicon dioxide.

Once a particular pattern of photoresist is formed atop the silicon dioxide of the wafer, portions of the wafer topped by silicon dioxide but not topped by photoresist may then be etched away from the wafer surface. Etching is a common procedure employed in manufacture of silicon integrated circuit devices. In general terms, etching is a process by which portions of a work piece may be selectively removed from the workpiece. The etch process yields a workpiece having the desired geographical arrangement, for further processing. After the etch, the photoresist is removed by a subsequent processing step, leaving the silicon wafer topped only by select configurations of silicon dioxide. As will be hereinafter more fully described, a variety of etching techniques may be employed.

In addition to the silicon dioxide/photoresist/etch method previously described, there are various other methods for selectively forming silicon dioxide atop a silicon wafer. Local oxidation, for example, is another common technique. This technique provides for selective oxide growth on a wafer and may be employed in, for example, NMOS, CMOS, and bi-polar technology. In local oxidation, a masking material, for example, silicon nitrate ($Si_3N_4$) is layered atop the silicon wafer. Thereafter, the wafer surface is subjected to oxidation conditions. The oxidation occurs only on the exposed surfaces of the silicon wafer not covered by the silicon nitride, thus, forming the desired geographical configuration.

When a desired geographic configuration of the wafer has been obtained, the wafer is fixed with appropriate conductive paths and connections. Those conductive paths and connections may be formed in a variety of manners, for example, by deposition, diffusion, implantation, and other techniques. In deposition, materials are selectively layered atop the wafer either by chemical or physical means. Chemical means are common for depositing polycrystalline silicon (hereinafter "POLY") to form gates and connections of the silicon semi-conductor device. Diffusion, on the other hand, is a process which allows dopant atoms, for example, of boron, phosphorous, arsenic, or antimony, to move within the solid silicon of the wafer. The diffusion process occurs at an elevated temperature where there is a concentration gradient between dopant atoms external to the silicon wafer and dopant atoms diffusing into the silicon wafer and is typically employed when forming P-type and N-type regions of a silicon semi-conductor device. In another technique, implantation, electrically neutral dopant atoms are converted into ions and caused, by a collimated ion beam, to accelerate to gain high kinetic energy. These high energy ions are directed toward the silicon wafer and thereby caused to be implanted in a localized manner at a desired depth within the silicon of the wafer. A number of other techniques and combinations are also possible.

As previously alluded to herein, etching is a common technique employed at various stages of the silicon semi-conductor device manufacturing process. Various etching techniques may be employed. The techniques are characterized by their selectively for particular materials being etched and their degree of anisotrophy, i.e., anisotropic etching occurs in a single direction and isotropic etching occurs in all directions. Etching may be by chemical means, physical means, or a combination of those means. Further, etching may be either wet etching, i.e., etching takes place in a liquid, or dry etching, i.e., etching takes place in a gas. In any event, the objective in any etching process is appropriate removal of particular materials from the wafer without causing adverse damage to the wafer.

By means and particular ordering of these various steps of oxide growth, patterning, etching, deposition, diffusion, implantation, and other techniques, a desired configuration of a silicon semi-conductor device may be manufactured.

These and other manufacturing processes are used to make silicon semi-conductor devices such as ROM storage devices, programmable logic array (PLA) devices, and the like. A mask programable ROM storage device is a device which has had various messages pre-coded into the device during the manufacturing process and which cannot be changed after the ROM storage device has been manufactured. A ROM core in the ROM storage device contains an array of transistors in rows and columns which are positioned to store the pre-programmed message or data. A sensing scheme in the ROM storage device determines the pre-coded message of the ROM core at specific locations which are determined by column decode and row decode sections of the ROM storage device which receive address codes for evaluating the message or data of a specific location in the ROM core.

The data stored in the ROM storage device is programmed into the ROM core during manufacture of the ROM storage device. The ROM core has a grid of rows and columns which contain transistors connected at specific intersections depending on the data message which is programmed into the ROM core.

In manufacturing semi-conductors with transistors, decisions on whether a transistor is to be placed in a substrate or not must be made at the level where the diffusion mask is first used. The manufacturing step first using a diffusion mask is relatively early in the manufacturing process. Therefore, after a manufacturer has received the unique customer requirements for a semi-conductor device, the manufacturer must proceed through many manufacturing steps to achieve the final product.

One disadvantage to the prior art method of forming an array of transistors in a semi-conductor device is the amount of time required to manufacture the semi-conductor device after the manufacturer has received the customer's unique program requirements. Because changes to meet unique program requirements have been necessarily made at an early stage of the manufacturing process, the semi-conductors cannot be pre-prepared, save only additions needed to comply with the unique program requirements at a later step. Therefore, a customer must wait through multiple steps in the manufacturing process before delivery of a semi-conductor device manufactured to unique program requirements.

SUMMARY OF THE INVENTION

In one embodiment, the invention is an array of transistors of a semi-conductor device. The array comprises a substrate having an array of drain and source diffusion implant pairs formed therein, and an insulative layer covering the substrate. Rows of gate material are enclosed within the insulative layer and positioned relative to the drain and source implants in the substrate to form an array of transistors. Windows are formed within the insulative layer which expose the drain implants for transistors in the array which must be connected to the respective columns for the programmed message in the programmed transistor array. Columns of metal layers are attached to the insulative layer and electrically connect to the drain implants exposed by windows in the insulative material.

In another embodiment, the invention is a method of forming an array of transistors. One step in the method is providing a semi-conductor device having a substrate with a plurality of pairs of drain implants and source implants arranged in an array with the source implants formed for electrically connecting to ground, and an insulative layer over the substrate and implants with a plurality of rows of gate material therein positioned over the drain and source implants so as to form a transistor at each position in the array. Another step in the method is programming the array of transistors by selecting which transistors must be connected for representing the data to be programmed, forming a contact window in the insulative material covering the drain implant for each transistor to be connected, and forming a plurality of columns of metal on the insulative material which pass over the transistors in the array and electrically connect to the drain implant which have a contact window formed in the insulative material above those drain implants.

BRIEF DESCRIPTION OF THE DRAWINGS

For a more complete understanding of the present invention, and for further objects and advantages thereof, reference may now be had to the following detailed description, taken in conjunction with the accompanying drawings, wherein.

DETAILED DESCRIPTION

References herein to columns and rows refer to imaginary coordinates of a grid having intersections located at positions where transistors could be located in either a schematic of an electric circuit or a semi-conductor device which functions as the electric circuit. References herein to nodes refer to electrical connections between points in either a schematic of an electric current or a semi-conductor device which functions as the electric circuit.

Figure 1:
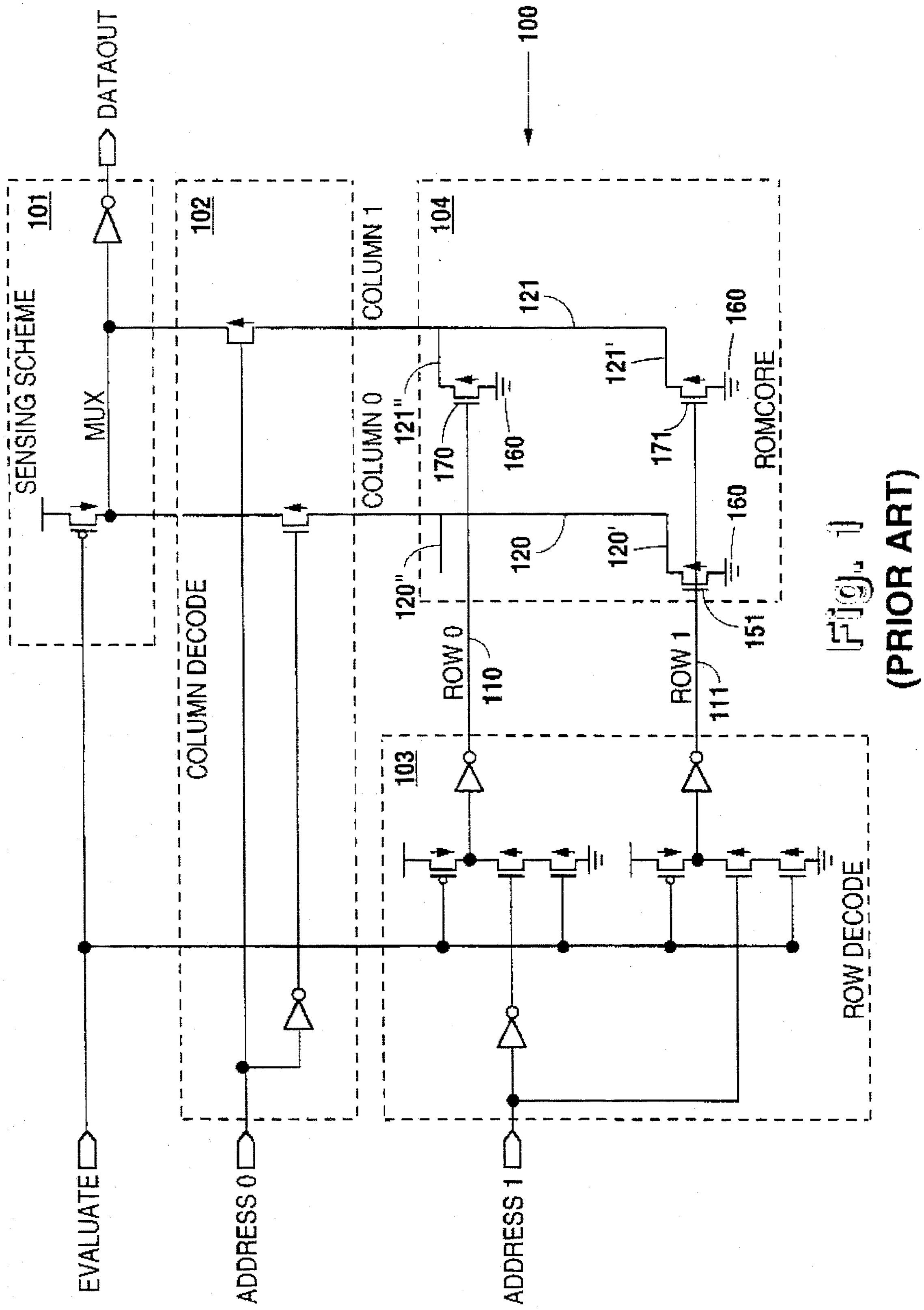
FIG. 1 is a schematic of a prior art ROM device.

Referring first to FIG. 1, there is shown a schematic of a prior art NOR-structured ROM storage device, generally indicated by 100. The ROM storage device 100 comprises a sensing scheme circuit 101, a column decode circuit 102, a row decode circuit 103, and a transistor array or ROM core 104, all electrically connected so that when the ROM storage device 100 receives an evaluate command for a specific address, a predetermined data message is output from the ROM storage device 100. The specific data messages for each individual address are programmed in the ROM core 104. The ROM core 104 contains a row 0 node 110, a row 1 node 111, a column 0 node 120, and a column 1 node 121, arranged in a grid. Transistors are located in an array at particular column and row intersections of the grid, depending on whether or not a transistor is required at the particular intersection to cause a specific data output of the ROM storage device 100 for a specific address evaluate command.

In a standard ROM core, the row nodes of the ROM core connect to gates of the transistors in the array. The column nodes of the ROM core have branch nodes for connecting to the drain implant of the transistors in the array. The source implant of the transistors in the array are connected to ground. In FIG. 1, the array of transistors in the ROM core 104 consists of transistors 151, 170, and 171. Although the transistors 151, 170 and 171 in FIG. 1 are N-type transistors, they could be P-type transistors or other devices. (If P-type transistors are used in the ROM core 104, the sensing scheme circuit 101, the column decode circuit 102, and the row decode circuit 103 of the ROM storage device 100 must be modified from that of FIG. 1 in order to accommodate the P-type transistors in the ROM core 104.) The transistor 151 is located at the intersection of row 1 and column 0, the transistor 170 is located at the intersection of row 0 and column 1, and the transistor 171 is located at the intersection of row 1 and column 1. The row 0 node connects only to the gate of transistor 170. The row 1 node 111 connects to the gate of transistors 151 and 171. The column 0 node 120 has branch nodes 120' and 120", and the column 1 node 121 has branch nodes 121' and 121". The branch node 120 of the column 0 node 120 connects with the drain implant of the transistor 150, and the branch node 120" does not make a connection to a transistor. The branch node 121' of the column 1 node 121 connects to the drain implant of the transistor 171, and the branch node 121" connects to the drain implant of the transistor 170. The source implant of transistors 151, 170 and 171, each connect to ground 160.

Still referring to FIG. 1, it can be seen how the ROM core 104 retains a unique data message for each address to be evaluated. The row 0 node is only connected to the gate of the transistor 170, which regulates the connection of the ground 160 to the column 1 node 121. When the row 0 node 110 is low, the transistor 170 will not conduct between the column 1 node 121 and the ground 160. However, when the row 0 node 110 is high, the transistor 170 connects the ground 160 to the column 1 node 121 through the branch node 121". The row 1 node 111 is connected to the transistor 151 at the column, and the transistor 171 at the column 1. When the row 1 node 111 is low, the transistors 151 and 171 do not connect ground 160 to either of the column 0 node 120 or the column 1 node 121. However, when row 1 node 111 is high, the transistors 151 and 171 connect the ground 160 to the column 0 node 120 and the column 1 node 121 through branch nodes 120' and 121", respectively. In this manner, the column 0 node 120 and column 1 node will have a ground state for each combination of row 0 node 110 and row 1 node 111 conditions as shown in table 1.

TABLE 1

| ROW 0 | ROW 1 | COLUMN 1 | COLUMN 0 |
|---|---|---|---|
| LOW | LOW | NO GROUND | NO GROUND |
| HIGH | LOW | NO GROUND | GROUNDED |
| LOW | HIGH | GROUNDED | GROUNDED |
| HIGH | HIGH | GROUNDED | GROUNDED |

Referring still to FIG. 1, it can be seen how the ROM storage device 100 utilizes the ROM core 104 to produce a unique data out message for each evaluate command having a specific address. Prior to receiving an evaluate command, the row 0 and row 1 are held low while the MUX in the sensing scheme is pre-charged. When an evaluate command and address are sent to the ROM storage device 100, one of the row lines goes high and may or may not pull the selected column low, depending on whether or not there is a transistor in the ROM core at the intersection of the specific row line going high and the selected column line. If a row line connected to the transistor on the selected column line goes high, then the transistor at the selected column line and high row line will ground the selected column line and deplete the charge from the MUX, thereby causing the data out to go high. If no row line connected to a transmitter on the selected column line goes high, then the selected column line will not deplete the charge on the MUX in the sensing scheme circuit 101, thereby causing data out to be low. Table 2 illustrates the programming of the ROM storage device in FIG. 1.

TABLE 2

| ADDRESS 1 | ADDRESS 0 | DATAOUT |
|---|---|---|
| 0 | 0 | 0 |
| 0 | 1 | 1 |
| 1 | 0 | 1 |
| 1 | 1 | 1 |

Figure 2:
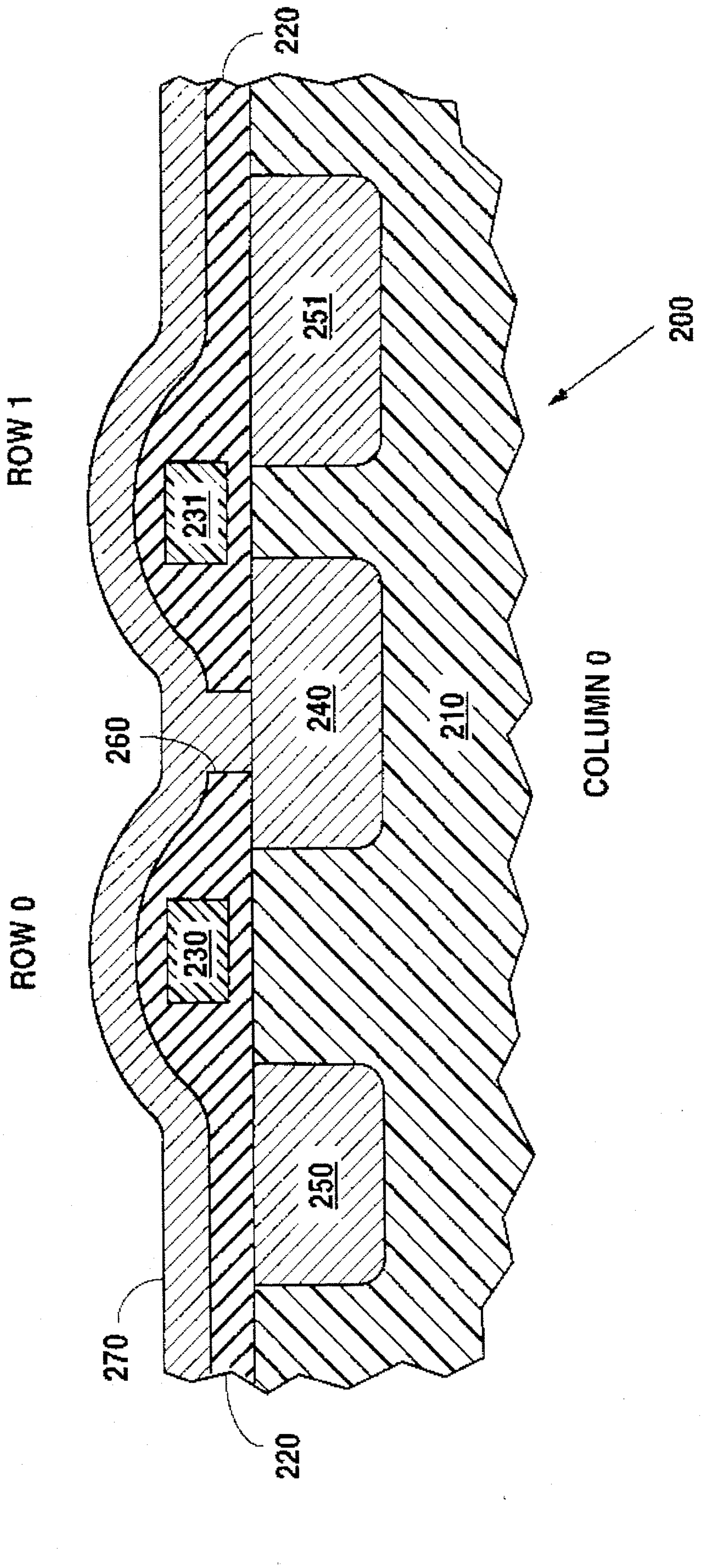
FIG. 2 is a partial cross-sectional view of a prior art semi-conductor device forming an electrical circuit for column 0 in the ROM core of FIG. 1.

Referring now to FIG. 2, there is shown a cross sectional view of a prior art semi-conductor device, indicated generally at 200, taken about a sectional line for the area of the semi-conductor device which performs the functions on the column 0 node 120 in FIG. 1. The semi-conductor device 200 in FIG. 2 comprises a substrate 210 having diffusion implants 240, 250 and 241 formed therein. To form N-type transistors, the substrate is a P-type material and the implants are an N-type material. However, P-type transistors can be formed by reversing the type of materials used in forming the substrate and implants. An oxide or resistance layer 220 covers the substrate and contains the polycrystalline gates 230 and 231. A metal layer 270 covers the oxide layer 220 and passes through a window 260 in the oxide layer 220 for electrically connecting to the implant 250 in the substrate 210. The implants 240 and 250 do not align underneath the gate 230, however, the implants 240 and 251 do align below the gate 231. The implants 250 and 251 are also connected to ground.

Still referring to FIG. 2, it can be seen how the semi-conductor device 200 operates to perform the functions of column 0 in the ROM core of FIG. 1. The metal layer 270 acts as the column 0 node 120 of FIG. 1, and the drain implant 250 in the substrate 210 acts as the branch nodes 120' and 120" of FIG. 1. The gate 230 acts as the row 0 node 110 and the gate 231 acts as the row 1 node 111. Therefore, when the gate 231 acts upon the substrate 210 therebeneath, the substrate 210 conducts between the drain implant 240 and the source implant 251, to cause the metal 270 representing the column 0 node 120 to ground through the transistor device formed therein.

Still referring to FIGS. 1 and 2 in combination, the intersection of column 0 and row 0 is represented by the area around and below the gate 230. As previously noted, the drain implant 240 and source implant 250 do not align below the gate 230. In this manner, any action on the substrate 210 below the gate 230 will be insufficient to make a connection between the drain implant 240 and the source implant 250. Therefore, no transistor has been formed in the semi-conductor device 200 at the intersection of column 0 and row 0.

Referring still to FIGS. 1 and 2 in combination, the intersection of column 0 and row 1 is represented by the area around and below the gate 231. As previously noted, the drain implant 240 and the source implant 251 have been formed in the substrate to align directly below the gate 231. Therefore, when the gate 231 influences the substrate 210, a connection will be formed between the drain implant 240 and the source implant 251. The influence of gate 231 upon the substrate 210 to connect the drain implant 240 with the source implant 251 performs the same functions as the transistor 151 in the ROM core 104 of FIG. 1. From the foregoing, it can be seen that by controlling the diffused area of drain implants and source implants, the prior art silicon device 200 can selectively form transistors at column and row locations for the purpose of programming the ROM core used in a ROM storage device.

Figure 3:
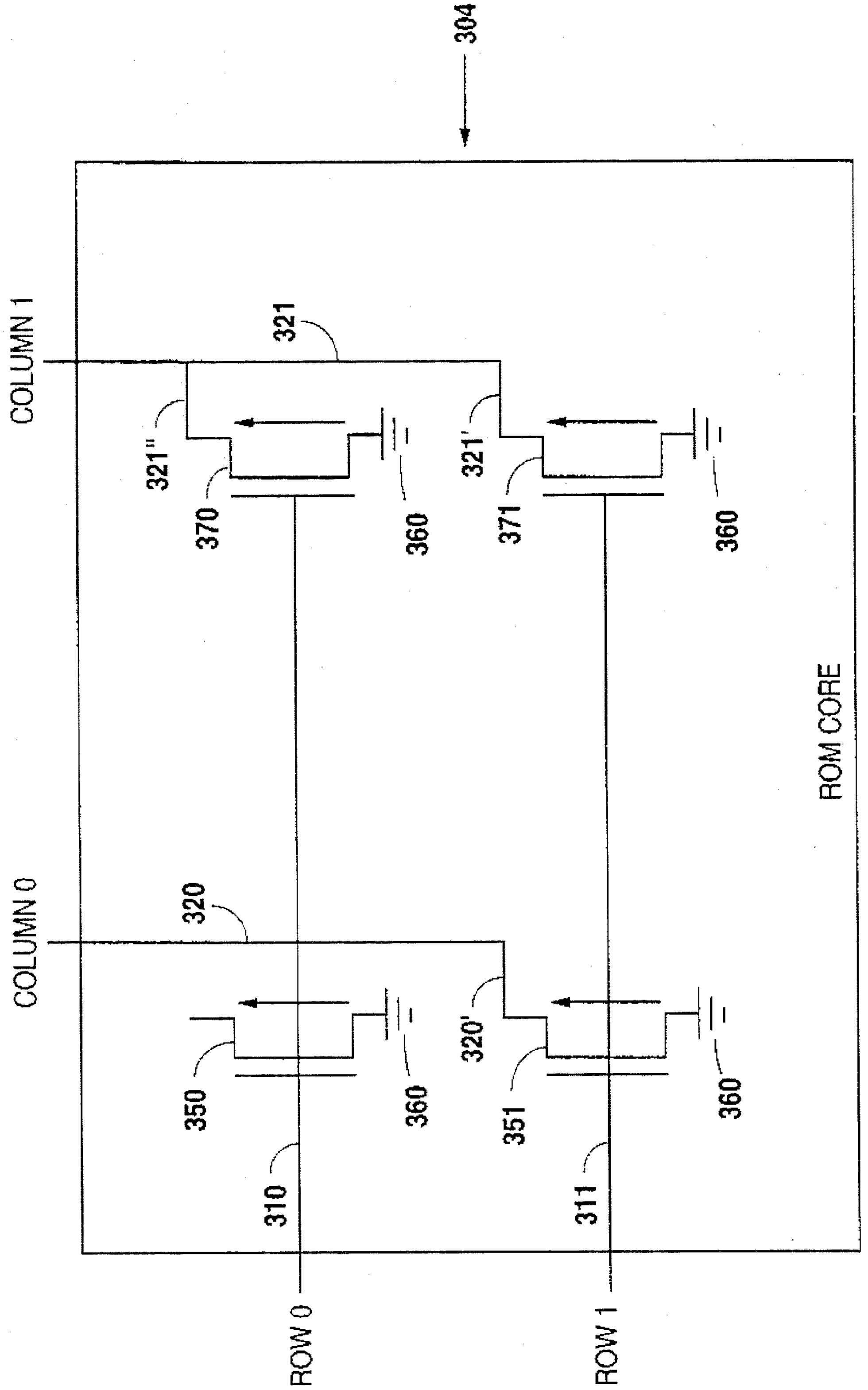
FIG. 3 is a schematic illustrating an embodiment of a ROM core according to the principles of the present invention for use within the ROM storage device in FIG. 1.

Referring now to FIG. 3, there is shown a schematic of an embodiment of the ROM core according to the principles of the present invention, shown generally at 304, for use in a semi-conductor device. The ROM core 304 in FIG. 3 has a column 0 node 320 and a column 1 node 321 arranged in a grid pattern with a row 0 node 310 and a row 1 node 311. At the intersection of the various columns and rows are formed transistors 350, 351, 370 and 371. The transistors 350, 351, 370 and 371 in FIG. 3 are N-type transistors, however, if desired, could be P-type transistors or other devices. The source implant for the transistors 350, 351, 370 and 371, are connected to ground 360. The row 0 node 310 connects to the gate of transistors 350 and 370. The row 1 node 311 connects to the gate of transistors 351 and 371. The column 0 node 320 has a branch node 320' which connects to a drain implant of the transistor 351. The column 1 node 321 has branch nodes 321' and 321" which connect to the drain implants of transistors 371 and 370, respectively.

Referring now to FIGS. 1 and 3, it can be seen that the ROM core 304 in FIG. 3 will perform the same logic functions as the ROM core 104 in FIG. 1. For both the ROM core 304 and the ROM core 104, transistors are located at the intersections of column 0 and row 1, column 1 and row 0, and column 1 and row 1. At column 0 and row 0 of the ROM core 104, the column 0 node 120 has a branch node 120" for connection to a transistor, however, no transistor exists at that location. In contrast, the ROM core 304 has a transistor 350 located at column 0 and row 0, however, there is no branch node for connecting the drain implant of transistor 350 to the column 0 node.

Figure 4:
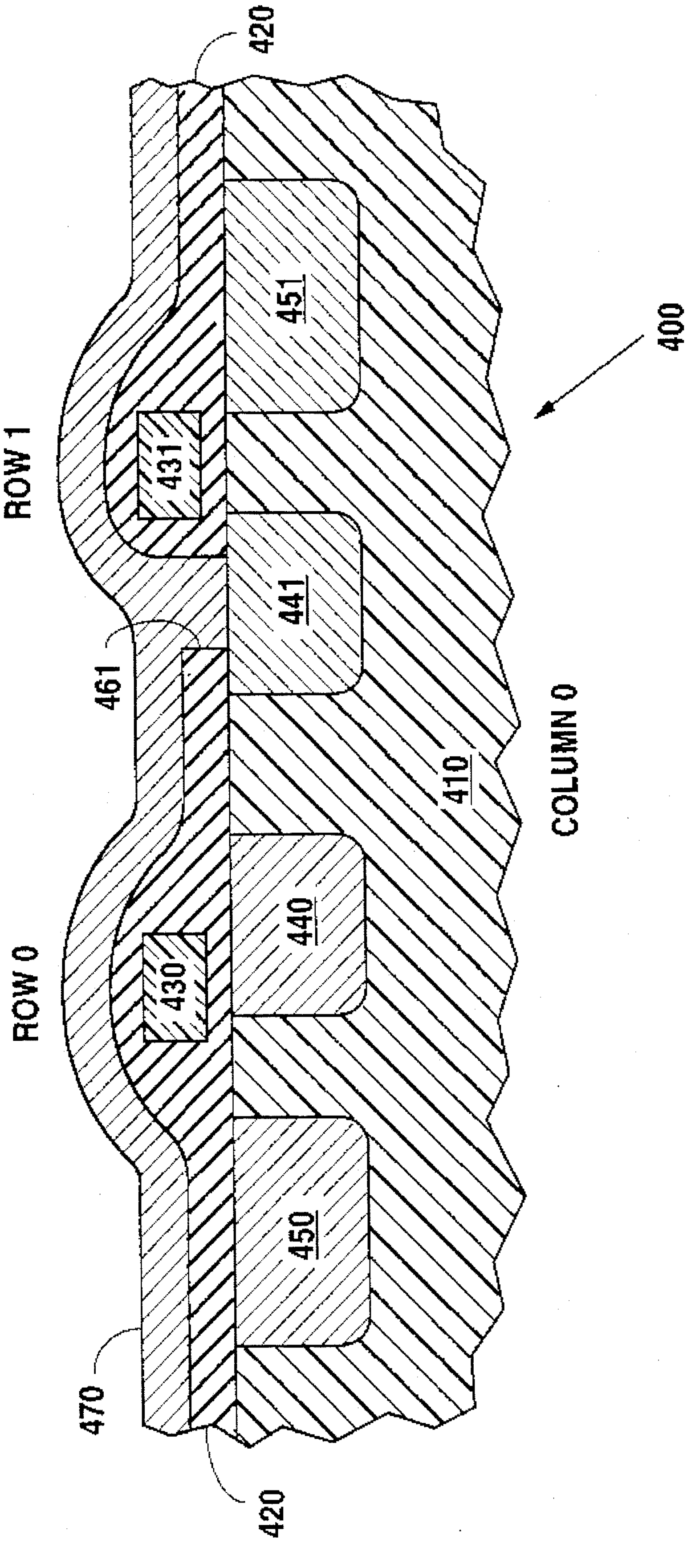
FIG. 4 is a cross-sectional view of an embodiment of a semi-conductor device, according to the principals of the present invention, that functions as the circuit illustrated in FIG. 3, said cross -section being taken along a sectional line that is functionally equivalent to the column 0 of the ROM core in FIG. 3.

Referring now to FIG. 4, there is shown a cross-sectional view of a embodiment of a semi-conductor device of the present invention, indicated generally at 400, said cross-section being taken at a section line of the device that is functionally equivalent to the column 0 in FIG. 3. The semi-conductor device 400 has a substrate 410 with drain implants 440 and 441, and source implants 450 and 451 formed therein. To form N-type transistors, the substrate is a P-type material and the implants are an N-type material. (P-type transistors (or other devices) could also be formed by reversing the type of materials used in forming the substrate and implants (or otherwise).) Covering the substrate 410 is an oxide or insulative layer 420. Within the oxide or protective layer 420 are gates 430 and 431. A metal 470 covers the oxide layer 420 and passes through a window 461 in the oxide layer 420 to make an electrical connection with the drain implant 441 in the substrate 410. The source implants 450 and 451 are connected to ground.

Referring now to FIGS. 3 and 4 in combination, the intersection of column 0 and row 0 is represented in the semi-conductor device 400 as the area around and below the gate 430. Because the drain implant 450 and the source implant 440 are aligned directly below the gate 430, the action by the gate 430 on substrate 410 directly therebeneath gate 430 will cause a connection between the drain implant 440 and the source implant 450. Therefore, a transistor is formed at the area representing the intersection of row 0 and column 0. However, the metal 470 representing the column 0 node 320 does not make a connection to the drain implant 440. Therefore, although a transistor has been formed in the semi-conductor device 400 in the area of the intersection of column 0 and row 0, no connection has been made by the column 0 node or metal 470 to the transistor.

Still referring to FIGS. 3 and 4 in combination, the intersection of column 0 and row 1 in FIG. 3 is represented in the semi-conductor device 400 in FIG. 4 by the area around and below the gate 431. Because the drain implant 441 and the source implant 451 have been formed to align below the gate 431, a transistor exists in the semi-conductor device 400 at an area representing the intersection of column 0 and row 1. The metal 470 representing the column 0 node 320 is connected by metal passing through window 461 and electrically connecting with the drain implant 441 in the substrate 410. Therefore, when the gate 431 acts upon the substrate 410 therebeneath, the substrate 410 conducts between the drain implant 441 and the source implant 451 to cause the metal 470, representing the column 0 node 320, to ground through the transistor device formed therein. From the foregoing, it can be seen that the present invention can program the ROM core of a ROM storage device by placing transistors at every intersection of the column and nodes, however, controlling the contact windows 461 so that the metal layer only makes electrical contact with the drain implants of transistors in the row column sections requiring a transistor connection for the program.

Figure 5:
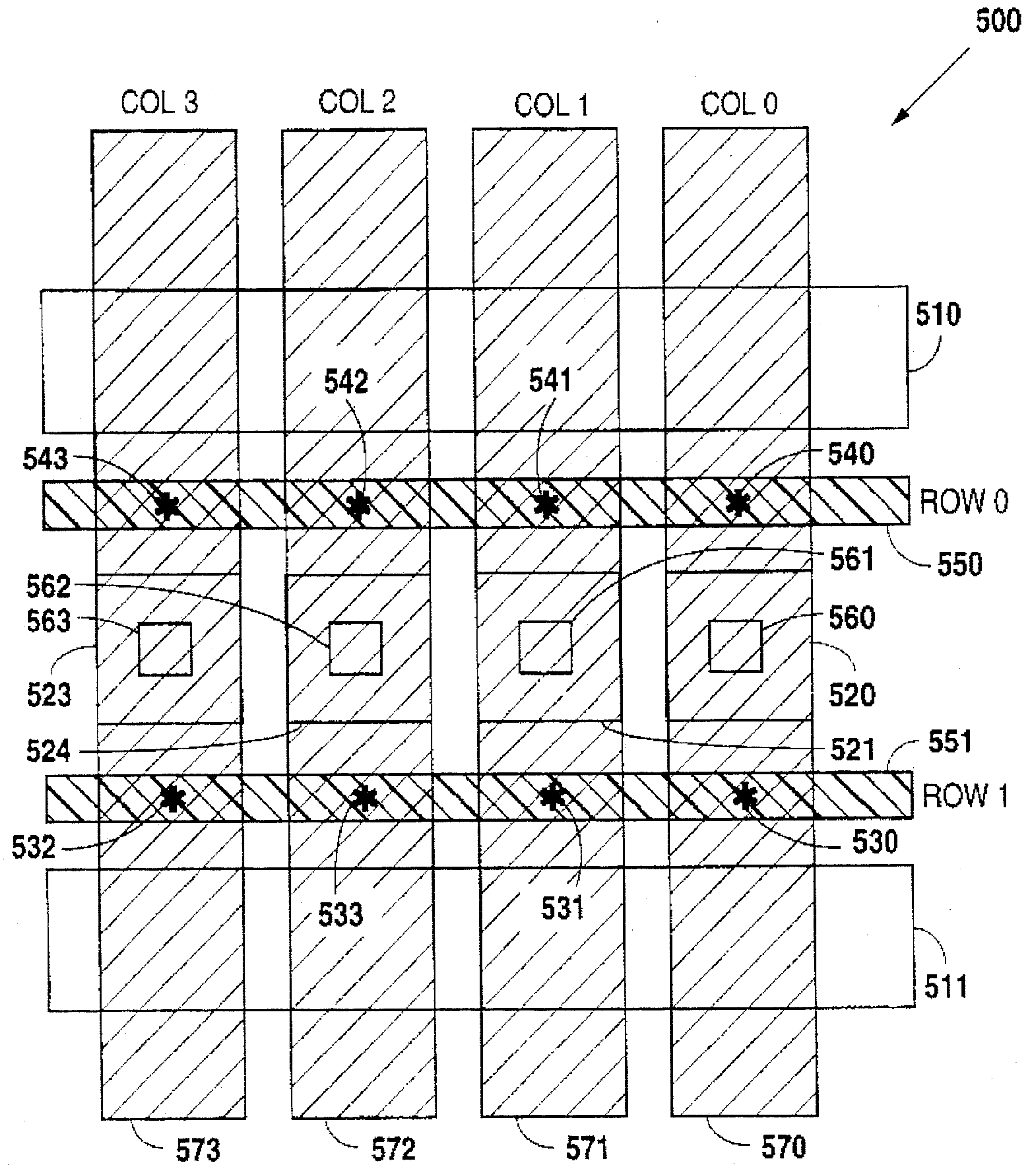
FIG. 5 illustrates a mask work which may be used in manufacture of the prior art silicon device of FIG. 2.

Referring now to FIG. 5, there is shown a prior art mask work indicated generally at 500. The mask work 500 is used in the manufacturing process of producing the semi-conductor device 200 of FIG. 2 which corresponds to the circuit of the ROM core 104 in FIG. 1. The manufacture of a semi-conductor device using this prior art mask work starts with the use of a wafer which is treated to have a proper substrate, either P-type or N-type, and has an oxide surface over the top portion. Because the transistors formed in the semi-conductor device 200 of FIG. 2 are N-type transistors, the substrate for the semi-conductor device 200 is a P-type substrate. However, an N-type substrate can be used when forming P-type transistors in the semi-conductor device.

The next step in the manufacture of a silicon semi-conductor device is typically the use of a diffusion mask to reduce the thickness of the oxide in the area for which transistors are to be formed in the substrate. In the prior art, the diffusion mask starts with the standard diffusion mask areas 510, 511, 520, 521, 522 and 523, and adds diffusion plugs at various potential plugsites which represent the row and column intersections at which the transistors will be located. The diffusion mask, having standard diffusion areas 510–511 and 520–523 combined with diffusion plugs located at specific potential plugsites 530–533 and 542–543, are utilized for reducing the oxide layer thickness in the area defined by the diffusion mask.

Following reduction of the oxide, the poly masks 550 and 551 are utilized to place a layer of the polycrystalline gate material on top of the oxide of the silicon device in the areas represented by the poly masks 550–551. The diffusion mask comprising the standard diffusion areas 510–511 and 520–523, with the diffusion plugs located in the various specific potential plugsites 530–533 and 540–543, are placed on top of the polycrystalline and oxide layer on top of the silicon chip. The diffusion mask is then used to further remove the oxide in the area corresponding to the shape of the diffusion mask. It should be noted that the oxide located within the diffusion mask areas but under the polycrystalline layer will not be removed, leaving a protective layer of oxide between the substrate and the polycrystalline layer. Once the oxide has been removed from the area below the diffusion mask, the substrate is doped with appropriate atoms to create the contact areas within the substrate. In the semi-conductor device 200 of FIG. 2, the implants are doped so that the implant areas will be an N-type area within the P-type substrate. (When instead forming P-type transistors, however, it is possible to dope the existing N-type substrate so that the implant areas become a P-type area.)

Following the use of the diffusion mask to create the implant areas, an oxide layer is placed over the top of the semi-conductor layers to protect the exposed substrate and implant areas, as well as the polycrystalline rows. Next, the contact window mask, having contact window areas 560, 561, 562 and 563, is placed on top of the second oxide layer and utilized to remove all of the oxide in the area represented by the contact window areas 560–563. Once the contact window areas have been removed from the oxide, the metal mask, having areas 570, 571, 572 and 573, is utilized to place a metal layer over the top of the semi-conductor device. Because the contact windows have been etched through the oxide layer to the drain implants in the substrate, the metal will electrically connect to those drain implants in the substrate.

Referring now to FIGS. 2 and 5 in combination, the masks 500 are utilized generally as described above to form the semi-conductor device 200, with the decision to place plugs in the diffusion mask at locations where transistors are located on the semi-conductor device 200, and not to place plugs in the potential plugsites where no transistor is to be formed in the semi-conductor device 200. As an example, the diffusion mask for column 0 will have the standard diffusion areas 510, 511 and 520, and only one diffusion plug located at potential plugsite 530. No diffusion plug is inserted at potential plugsite 550. In this manner, below the potential plugsite 550 the implant areas will form in alignment with the row 551. In contrast, at potential plugsite 540, there will be no diffusion plug, which allows the implant areas below row 0, column 0, to align below the poly area to form a transistor. Therefore, column 0 will have a transistor located at column 0 and row 1, and no transistor located at column 0 and row 0. From the foregoing, it can be seen that this process of selectively determining plug locations for the diffusion mask can be repeated for each column of the semi-conductor device 200 so that the transistors either are or are not placed at the desired intersection of the specific rows and columns.

Figure 6:
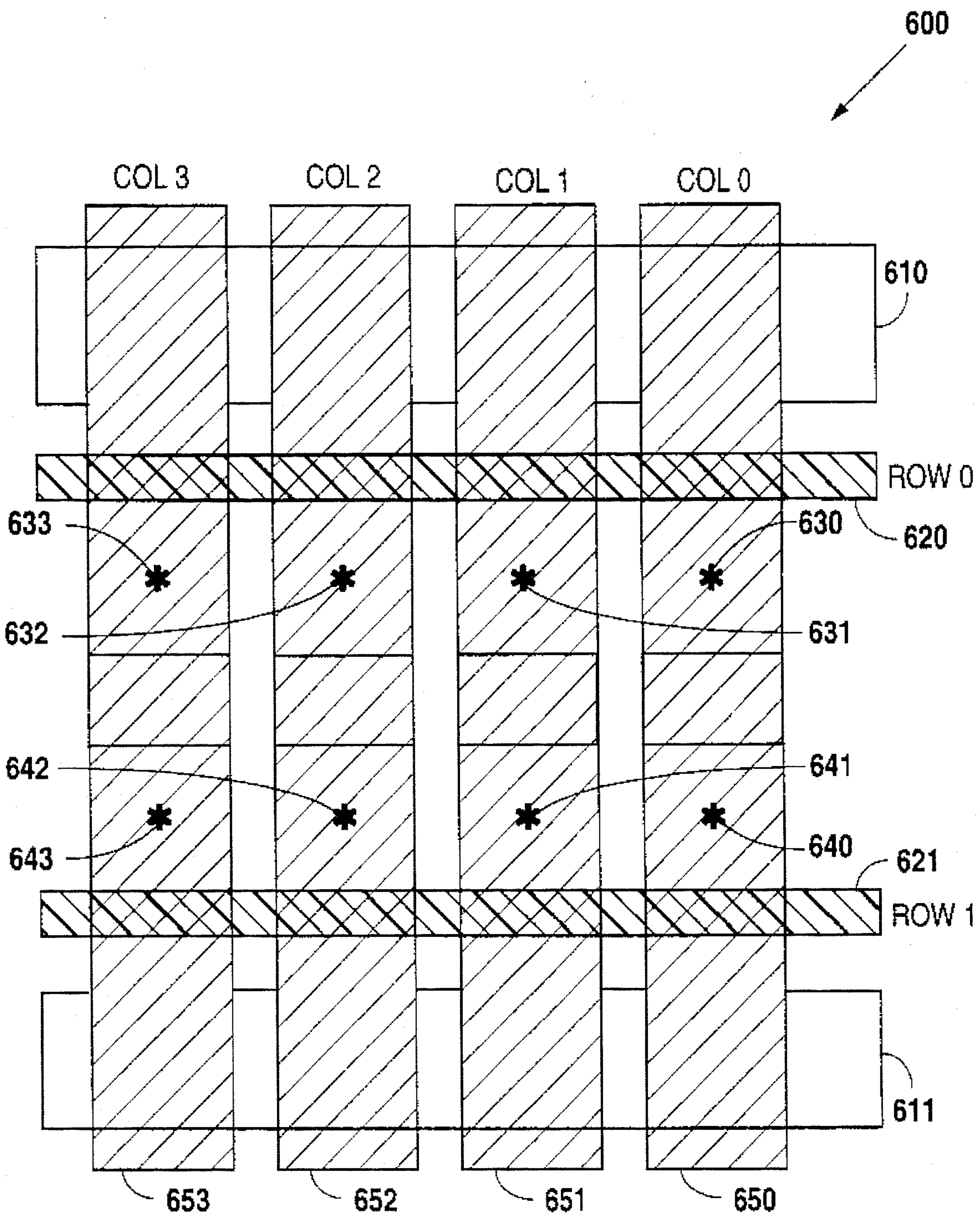
FIG. 6 illustrates a mask work which may be used in manufacture of the semi-conductor device of FIG. 4.

Referring now to FIG. 6, there is shown a mask work for the present invention indicated generally at 600. The mask work 600 is utilized to form the silicon semi-conductor device 400 in FIG. 4. As with the prior art device in FIG. 5, the manufacturing process starts with treating a silicon wafer to form a substrate and covering that silicon wafer with an oxide material. The diffusion mask, having diffusion areas 610 and 611, is utilized to reduce the oxide thickness in those areas. The poly mask, having poly areas 620 and 621, is then utilized to place the polycrystalline gate material in the areas represented by 620 and 621.

Following placement of the poly layer, the diffusion mask is then again utilized to etch away the first oxide layer and for causing diffusion in the substrate at areas represented by 620 and 621. In the semi-conductor device 400 of FIG. 4, the implants are doped so that the implant areas will be an N-type area within the P-type substrate. (When forming P-type transistors, however, it is possible to dope the existing N-type substrate so that the implant areas become a P-type area.) Also, it should be noted that the poly previously laid down will not be etched away and will cause the diffusion to occur on either side, but not below, the poly area. A new layer of oxide is then placed over the entire area protecting the poly areas and the exposed substrate and implants therein. At this point in the processing, a transistor has been formed at every row and column intersection. However, there is no connection to the drain implants for completing the use of a transistor.

The connection of a column to a particular transistor is accomplished by etching contact windows in the oxide layers covering the implants in the substrates. The location for placing these contact windows is represented by potential plugsites 630–633 and 640–643. However, it is typically not desired to connect all transistors to the respective columns. Therefore, the contact windows are treated as plugs and placed in the contact window mask only when it is desired to connect a column to a specific transistor at a specific row. For example, in column 0 of FIG. 4, it is desired to connect the column with the drain implant of a transistor located below row 1. Therefore, a contact plug will be placed in the contact window mask at potential plugsite 640. When it is not desired to connect a specific column to a transistor at a specific row, no plug will be placed at the potential plugsite for that intersection of the row and the column. For example, in FIG. 4, when it is desired to not connect column 0 with a drain implant of a transistor at row 0, no plug is placed in the contact window mask at the potential plugsite 630. Therefore, although a transistor exists at the intersection of row 0 and column 0, no connection is made by column 0 to that transistor.

Referring now to FIGS. 2, 4, 5 and 6 in combination, the advantages of the present invention can be illustrated. In processing the prior art semi-conductor device of FIGS. 2 and 5, the prior art semi-conductor device only forms a transistor at row and column locations where the transistor will be connected to the row and column. Because the forming of transistors requires changes in the diffusion mask and the diffusion mask is used in the beginning stages of manufacturing the semi-conductor device, the decisions of where to place a transistor based on unique customer requirements must be performed in the very first stages of manufacturing. Therefore, from the time that the customer places an order for a semi-conductor device having a unique transistor array, such as a ROM storage device, the semi-conductor device holding that transistor array must be processed from the state of changing the diffusion layer through the final stage of placing a metal layer over the top.

In contrast, the present invention places transistors at every row and column location, and fulfills the unique customer requirements connecting only the transistors at specific rows and columns, as necessary, to program the semi-conductor device for the unique customer requirements. This method of controlling the column connection to pre-existing transistors is performed in the contact layer at a much higher level in the process of manufacture of the semi-conductor device. As a result, the present invention allows the processing of semi-conductor devices to proceed through the step of forming oxide layer protecting the polycrystalline gate, substrate, and implants therein, without knowledge of the unique customer requirements. These partially completed semi-conductor devices can be stored until a customer places an order for devices meeting the customer's unique requirements. At the time of an order, the contact window mask can be modified by placing contact plugs in the plugsites where desired, in order to connect the specific columns to the transistors located below the specific rows. This process allows a manufacturer to complete semi-conductor devices meeting a customer' s unique requirements in a much shorter time after receipt of the order, in comparison with semi-conductor devices manufactured starting at an earlier stage of manufacturing process, such as, for example, the diffusion stage.

Based upon the foregoing, those skilled in the art will fully understand and appreciate the improvements in the art of the teachings herein. Those skilled in the art will also understand and appreciate that various alternatives, additions, and modifications may be made in embodiments and preferred embodiment described herein, and that the values and merits of forming transistors at every location in a grid of row and columns and then connecting the transistors to the row and columns only at grid locations where desired is significant. Further related details of related systems, apparatus and products may be found in the related cases listed in the Cross-Reference to Related Applications section above. Although those related details are not necessary in every case for those skilled in the art to practice the present invention or to comprehend its best mode of practice, those details may be useful to those skilled in the art and reference to them may be desirable.

Numerous modifications and variations of the embodiments and, in particular, the preferred embodiments of the invention are possible in light of the teachings herein. For example, although the description has disclosed the use of an array of transistors in one possible embodiment of a ROM core, other transistor arrays or other arrangements may be used in other devices, such as, for example, a PLA, or the like. Each of these modifications and variations are intended to be included in the description herein and form a part of the present invention. The foregoing detailed description is, thus, to be clearly understood as being given by way of illustration and example only, the spirit and scope of the present invention being limited solely by the appended claims.

What is claimed is:

1. An array of transistors in a semi-conductor device, said array being particularly programmed by operatively enabling select ones of said transistors of said array, comprising:

a substrate having an array of drain and source implant pairs formed therein, wherein said source implants are formed to connect with a ground;

an insulative layer covering said substrate and having a plurality of windows formed therethrough to expose said drain implants in said substrate at only select locations to operatively enable said transistors at said locations as desired to obtain said particular program;

a plurality of rows of gate material enclosed in said insulative layer and positioned relative to each of said drain and source implant pairs in said substrate to form an array of transistors; and a plurality of columns of a metal layer over said insulative layer, passing through said windows in said insulative material and electrically connecting to said drain implants therebelow.

2. A method of forming an array of transistors, comprising the steps of:

providing a semi-conductor device having a substrate with a plurality of pairs of drain implants and source implants arranged at select positions in an array with said source implants formed for electrical connection a ground, and an insulative layer over said substrate and said pairs with a plurality of rows of gate material therein positioned over said pairs to form a transistor at each position in said array; and programming said array of transistors by selecting particular transistors to represent particular data programmed, forming a contact window in said insulative layer covering said drain implant for each transistor to be connected, and forming a plurality of columns of metal on said insulative layer over the transistors in said array and electrically connect to said drain implants which have a contact window formed in said insulative layer above said drain implants.

* * * * *